US008160889B2

(12) United States Patent
Iser et al.

(10) Patent No.: US 8,160,889 B2
(45) Date of Patent: Apr. 17, 2012

(54) SYSTEM FOR PROVIDING AN ACOUSTIC SIGNAL WITH EXTENDED BANDWIDTH

(75) Inventors: Bernd Iser, Ulm (DE); Gerhard Nüssle, Blaustein (DE); Gerhard Uwe Schmidt, Ulm (DE)

(73) Assignee: Nuance Communications, Inc., Burlington, MA (US)

(*) Notice: Subject to any disclaimer, the term of this patent is extended or adjusted under 35 U.S.C. 154(b) by 1075 days.

(21) Appl. No.: 12/015,907

(22) Filed: Jan. 17, 2008

(65) Prior Publication Data

US 2008/0195392 A1 Aug. 14, 2008

(30) Foreign Application Priority Data

Jan. 18, 2007 (EP) .................................... 07001062

(51) Int. Cl.

| | |
|---|---|
| ***G10L 19/00*** | (2006.01) |
| ***G10L 11/00*** | (2006.01) |
| ***G10L 19/14*** | (2006.01) |
| ***G10L 21/02*** | (2006.01) |
| ***H04R 5/00*** | (2006.01) |
| ***H03G 5/00*** | (2006.01) |

(52) U.S. Cl. ........ 704/500; 704/200; 704/201; 704/205; 704/219; 704/226; 381/1; 381/98

(58) Field of Classification Search .................. 704/200, 704/201, 205, 219, 225, 226; 381/1, 98
See application file for complete search history.

(56) References Cited

U.S. PATENT DOCUMENTS

| | | | | |
|---|---|---|---|---|
| 5,839,101 | A * | 11/1998 | Vahatalo et al. | 704/226 |
| 6,889,182 | B2 * | 5/2005 | Gustafsson | 704/205 |
| 6,988,066 | B2 * | 1/2006 | Malah | 704/219 |
| 7,359,854 | B2 * | 4/2008 | Nilsson et al. | 704/219 |
| 7,676,043 | B1 * | 3/2010 | Tsutsui et al. | 381/1 |
| 7,715,573 | B1 * | 5/2010 | Yonemoto et al. | 381/98 |
| 7,734,462 | B2 * | 6/2010 | Kabal et al. | 704/201 |
| 2003/0187663 | A1 | 10/2003 | Truman | |
| 2007/0005351 | A1 * | 1/2007 | Sathyendra et al. | 704/223 |
| 2007/0299655 | A1 * | 12/2007 | Laaksonen et al. | 704/205 |

FOREIGN PATENT DOCUMENTS

EP 1 367 566 A2 12/2003

OTHER PUBLICATIONS

Chen, S.; Leung, H.; , "Artificial bandwidth extension of telephony speech by data hiding," Circuits and Systems, 2005. ISCAS 2005. IEEE International Symposium on , vol., No., pp. 3151-3154 vol. 4, May 23-26, 2005.*

(Continued)

*Primary Examiner* — Paras Shah

(74) *Attorney, Agent, or Firm* — Sunstein Kann Murphy & Timbers LLP

(57) ABSTRACT

A bandwidth extension system extends the bandwidth of an acoustic signal. By shifting a portion of the signal by a frequency value, the system generates an upper bandwidth extension signal. An extended bandwidth acoustic signal may be generated from the acoustic signal, the upper bandwidth extension signal, and/or a lower bandwidth extension signal.

20 Claims, 7 Drawing Sheets

OTHER PUBLICATIONS

Epps, J., Holmes, W.H., “A New Technique for Wideband Enhancement of Coded Narrowband Speech”, IEEE Workshop on Speech Coding, Conference Proceedings, pp. 174-176, Jun. 1999.

Iser, B., Schmidt, G., “Bandwidth Extension of Telephony Speech”, EURASIP Newsletter, vol. 16, No. 2, pp. 2-24, Jun. 2005.

Jax, P. “Enhancement of Bandwidth Limited Speech Signals: Algorithms and Theoretical Bounds”, Published Dissertation, Aachen, Germany 2002. pp. i-178.

Jax, P. “Bandwidth Extension for Speech.” *Audio Bandwidth Extension*. Ed. E. Larson and R.M. Aarts. New Jersey: Wiley Books, 2004. pp. 171-235.

Kornagel, U., “Spectral Widening of the Excitation Signal for Telephone-Band Speech Enhancement”, IWAENC ’01, Conference Proceedings, pp. 215-218, Sep. 2001.

Valin, J.-M., Lefebvre, Re., “Bandwidth Extension of Narrowband Speech for Low Bit-Rate Wideband Coding”, IEEE Workshop on Speech Coding, Conference Proceedings, pp. 130-132, Sep. 2000.

ETS 300 903 (GSM 03.50), “Transmission Planning Aspects of the Speech Service in the GSM Public Land Mobile Network (PLMS) System”, ETSI, France 1999.

ITU-T Recommendation G. 167, “General Characteristics of International Telephone Connections and International Telephone Circuits—Acoustic Echo Controllers,” Helsinki, Finland 1993.

Yasukawa, H. Ed., “Enhancement of Telephone Speech Quality by Simple Spectrum Extrapolation Method”, European Speech Communication Association (ESCA); 4th European Conference on Speech Communication and Technology. Eurospeech 1995. Madrid, Spain, vol. 2, Conf. 4, Sep. 18, 1995, pp. 1545-1548.

* cited by examiner

SYSTEM FOR PROVIDING AN ACOUSTIC SIGNAL WITH EXTENDED BANDWIDTH

PRIORITY CLAIM

This application claims the benefit of priority from European Patent Application No. 07001062.4, filed Jan. 18, 2007, which is incorporated by reference.

BACKGROUND OF THE INVENTION

1. Technical Field

The invention is directed to bandwidth extension and, more particularly, to providing an acoustic signal with extended bandwidth.

2. Related Art

Acoustic signals may be transmitted through analog or digital signal paths. A drawback of these signal paths is that they may restrict the bandwidth of the acoustic signals they carry. Because of this restricted bandwidth, the transmitted acoustic signals may differ from the original acoustic signals. When a transmission path restricts the bandwidth of speech signals, the quality and comprehensibility of these signals may suffer.

Some systems attempt to reduce these negative effects by applying bandwidth extension techniques. These systems receive a bandwidth restricted signal and attempt to reconstruct the missing frequency components of the received signal. The missing frequency components are re-synthesized blockwise. The system combines subsequent overlapping blocks to create the spectrally extended output signal. These systems may produce a noticeable block offset. This offset may cause significant artifacts to occur in the resulting signal. Furthermore, due to the use of block processing, these systems may introduce a delay into the signal path. Therefore, a need exists for an improved system for providing an acoustic signal with extended bandwidth.

SUMMARY

A bandwidth extension system extends the bandwidth of an acoustic signal. By shifting a portion of the signal by a frequency value, the system generates an upper bandwidth extension signal. An extended bandwidth acoustic signal may be generated from the acoustic signal, the upper bandwidth extension signal, and/or a lower bandwidth extension signal.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
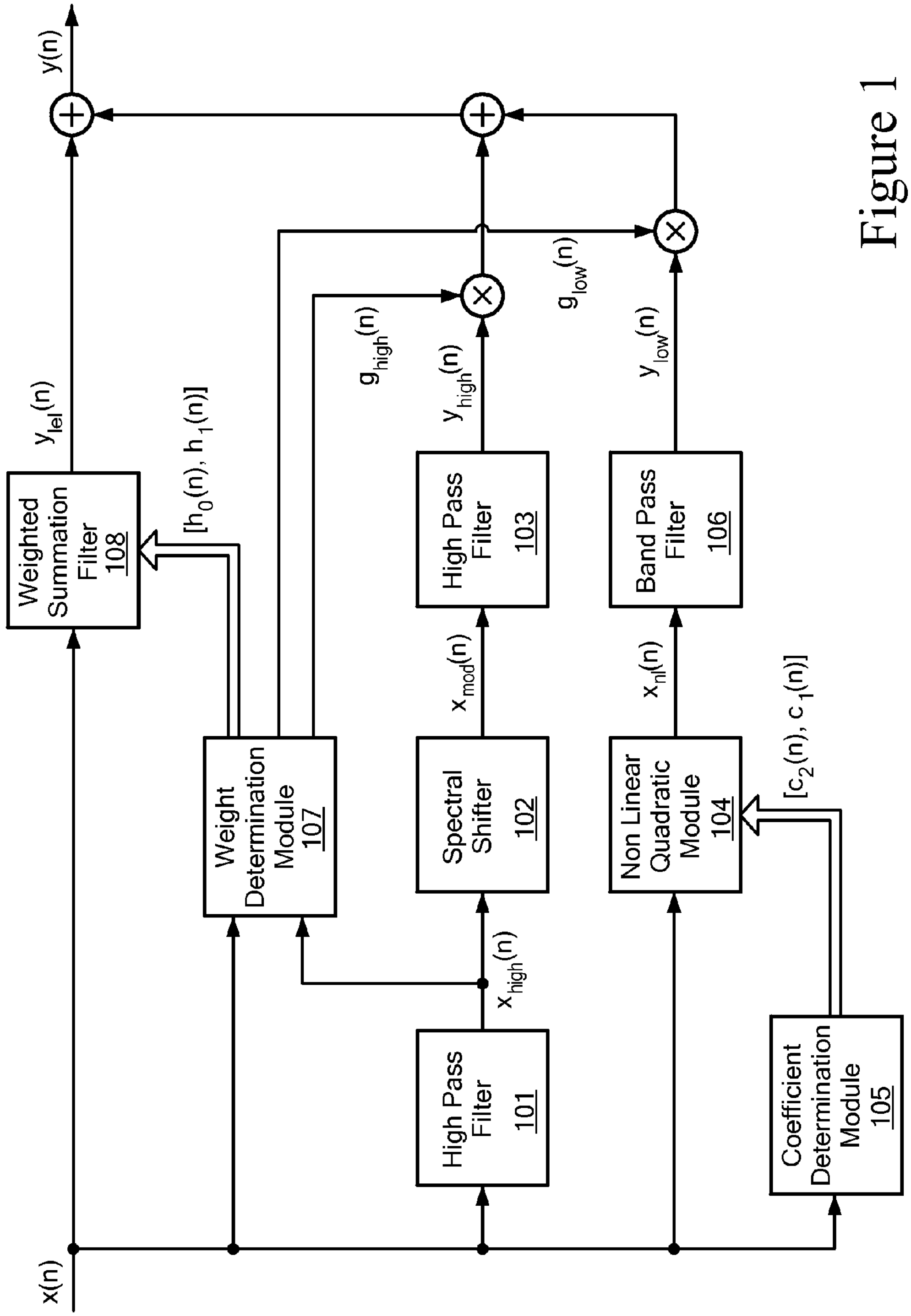
FIG. 1 is a signal flow of a system for providing an acoustic signal with extended bandwidth.

FIG. 1 illustrates a signal flow of a bandwidth extension system for providing an acoustic signal with extended bandwidth. The bandwidth of a received acoustic signal x(n) may be extended in both the upper and lower frequency directions. Alternatively, the bandwidth of the received acoustic signal may be extended in only one frequency direction.

The system may begin bandwidth extension upon receipt of an acoustic signal x(n). The acoustic signal x(n) may be a digital or a digitized signal where n denotes the time variable. The system processes the acoustic signal x(n) to generate an upper bandwidth extension signal $y_{high}(n)$ and/or a lower bandwidth extension signal $y_{low}(n)$. Some systems may generate only an upper bandwidth extension signal $y_{high}(n)$ to extend the bandwidth of the acoustic signal x(n) to higher frequency levels. Other systems may generate only a lower bandwidth extension signal $y_{low}(n)$ to extend the bandwidth of the acoustic signal x(n) to lower frequency levels. Still other systems generate both an upper bandwidth extension signal $y_{high}(n)$ and a lower bandwidth extension signal $y_{low}(n)$ to extend the bandwidth of the acoustic signal x(n) to both higher and lower frequency levels.

The system may generate the upper bandwidth extension signal $y_{high}(n)$ by passing the received acoustic signal x(n) through a high-pass filter 101, a spectral shifter 102, and a high-pass filter 103. The high-pass filter 101 removes frequency components of the received acoustic signal x(n) below a cutoff frequency. The cutoff frequency may be selected to prevent an overlap in the shifted spectra due to the cosine modulation that may be performed by the spectral shifter 102.

The high-pass filter 101 may comprise a recursive filter, such as a Chebyshev or Butterworth filter. The high pass filter 101 may have the following difference equation:

$$x_{high}(n) = \sum_{k=0}^{N_{hp,1}} b_{hp,1,k}\, x(n-k) + \sum_{k=1}^{\tilde{N}_{hp,1}} a_{hp,1,k}\, x_{high}(n-k)$$

The order of the high-pass filter 101 both in the finite impulse response ("FIR") part and the infinite impulse response ("IIR") part may range from about 4 to about 7. Some systems may use the following value:

$$N_{hp,1}=\tilde{N}_{hp,1}=6$$

Figure 2:
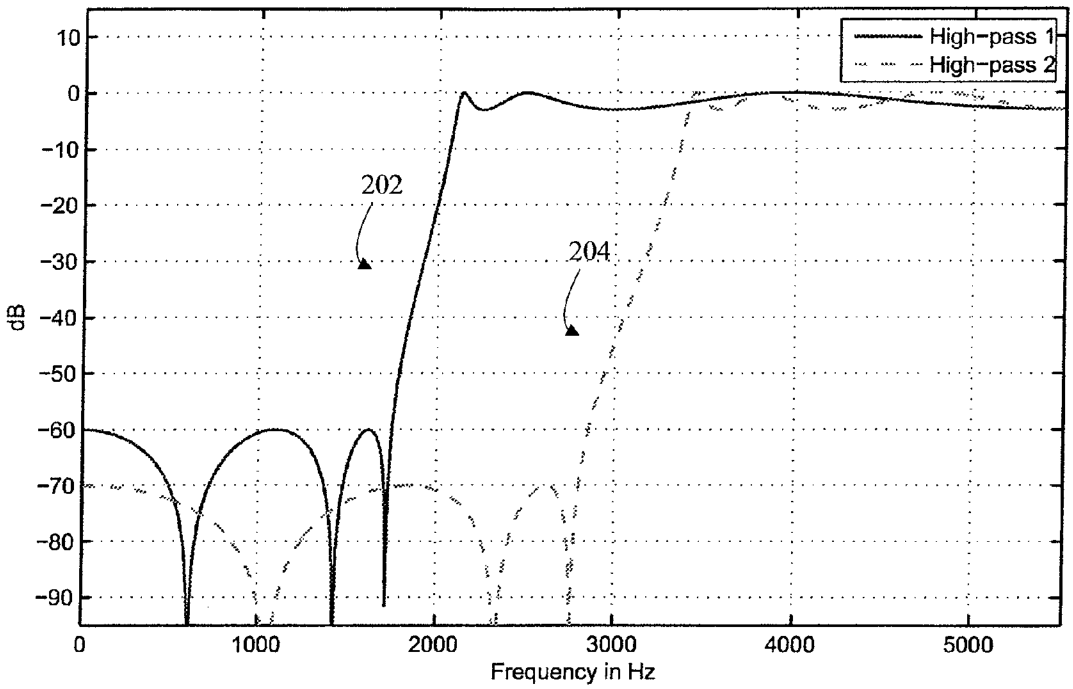
FIG. 2 is a graph of the frequency responses of two high-pass filters.

FIG. 2 illustrates the resulting modulus of the frequency response 202 of such a high-pass filter.

If the received acoustic signal x(n) contains only signal components up to approximately 4 kHz and the high-pass filter 101 has the frequency response 202 as shown in FIG. 2, then the resulting signal $x_{high}(n)$ of the high-pass filter 101 may contain relevant signal components between approximately 2 kHz and approximately 4 kHz. After the received acoustic signal x(n) passes through the high-pass filter 101, the filtered acoustic signal $x_{high}(n)$ may be passed to the spectral shifter 102. As shown in FIG. 1, some systems filter the portions of the received acoustic signal x(n) above a predetermined frequency before being shifted by the spectral shifter 102. Other systems may send the received acoustic signal x(n) to the spectral shifter 102 without filtering the signal.

In FIG. 1, the spectral shifter 102 may spectrally shift the filtered acoustic signal $x_{high}(n)$ by a predetermined shifting frequency value. The predetermined shifting frequency value may be selected so that the shifted signal covers a frequency range suitable for complementing the received acoustic signal x(n).

In some systems, the spectral shifter 102 may shift the entire received acoustic signal x(n) over its full range. In other systems, the spectral shifter 102 may shift only a portion of the received acoustic signal x(n). Specifically, the spectral shifter 102 may shift the portion of the received acoustic signal x(n) that is above a predetermined lower frequency value and/or below a predetermined upper frequency value.

The spectral shifter 102 may spectrally shift the filtered acoustic signal $x_{high}(n)$ by performing a cosine modulation. The cosine modulation may be obtained by performing a multiplication of the filtered acoustic signal $x_{high}(n)$ with a modulation function, such as a cosine function having the product of the shifting frequency and the time variable as arguments. The spectral shifter 102 may use a modulation frequency $\Omega_0$ of approximately 1380 Hz. If the sampling frequency for the acoustic signal x(n) is $f_s$=11,025 Hz, then the spectral shifter may store $N_{mod}$=8 cosine values. Cosine modulation may perform a frequency shift in both positive and negative frequency directions:

$$FT\{x(n)\cos(\Omega_0 n)\} = \frac{1}{2}X(e^{j(\Omega+\Omega_0)}) + \frac{1}{2}X(e^{j(\Omega-\Omega_0)})$$

The spectral shifter 102 multiplies the filtered acoustic signal $x_{high}(n)$ with a cosine function to generate a modulated signal $x_{mod}(n)$:

$$x_{mod}(n)=x_{high}(n)\cos(\Omega_0 \bmod(n,N_{mod}))$$

The term mod(n, $N_{mod}$) designates a modular addressing.

The modulated signal $x_{mod}(n)$ may be used as an upper bandwidth extension signal. Alternatively, additional processing of the modulated signal $x_{mod}(n)$ may increase the quality of the output signal. As shown in FIG. 1, some systems may filter portions of the modulated signal $x_{mod}(n)$ above a predetermined frequency before it is used as the upper bandwidth extension signal. Other systems may use the modulated signal $x_{mod}(n)$ as the upper bandwidth extension signal without filtering signals that are within a predetermined frequency range.

As cosine modulation may result in a frequency shift in both the upper and lower frequency directions, a second high-pass filter 103 may be applied on the modulated signal $x_{mod}(n)$ to generate a filtered upper bandwidth extension signal $y_{high}(n)$:

$$y_{high}(n) = \sum_{k=0}^{N_{hp,2}} b_{hp,2,k}\,x_{mod}(n-k) + \sum_{k=1}^{\tilde{N}_{hp,1}} a_{hp,2,k}\,y_{high}(n-k).$$

The high-pass filter 103 may comprise a recursive filter, such as a Chebyshev or Butterworth filter. In some systems, the order of the high-pass filter 103 may be different than the order of the high-pass filter 101. In other systems, the order of the high-pass filter 103 may be identical to the order of the high-pass filter 101. Some systems may use the following value:

$$N_{hp,2}=\tilde{N}_{hp,2}=6.$$

The high-pass filter 103 removes frequency components of the modulated signal $x_{mod}(n)$ below a cutoff frequency. The cutoff frequency of the high-pass filter 103 may correspond to the cutoff frequency of the high-pass filter 101 plus the shifting frequency value used by the spectral shifter 102.

The high-pass filter 103 may be designed such that the transition range starts at approximately 3400 Hz. FIG. 2 illustrates the modulus of the frequency response 204 of such a high-pass filter. Other systems may use high-pass filters with transition range cutoffs set to other values. The transition range may be selected based on the bandwidth of the received acoustic signal x(n). The output of the high-pass filter 103 is the filtered upper bandwidth extension signal $y_{high}(n)$.

The bandwidth extension system may generate a lower bandwidth extension signal $y_{low}(n)$ to extend the received acoustic signal x(n) to lower frequency ranges. The system may generate the lower bandwidth extension signal $y_{low}(n)$ by applying a non-linear quadratic characteristic to the received acoustic signal x(n) at block 104. The coefficients for this non-linear characteristic are determined at block 105. At block 105, the system may estimate the short time maximum $x_{max}(n)$ of the modulus of the received acoustic signal x(n). This estimation may be done recursively:

$$x_{max}(n) = \begin{cases} \max\{K_{max}|x(n)|,\ \kappa_{inc}x_{max}(n-1)\}, & \text{if } |x(n)| > x_{max}(n-1), \\ \kappa_{dec}x_{max}(n-1) & \text{else.} \end{cases}$$

The constants $\kappa_{dec}$ and $\kappa_{inc}$ used in this estimation may satisfy the following relation:

$$0<\kappa_{dec}<1<\kappa_{inc}.$$

The constant $K_{max}$ may be chosen from the following range:

$$0.25<K_{max}<4.$$

In some systems, the following constant values may be chosen:

$$K_{max}=0.8,$$

$$\kappa_{inc}=1.05, \text{ and}$$

$$\kappa_{dec}=0.995.$$

The non-linear characteristic applied at block 104 may be a quadratic characteristic with time dependent coefficients:

$$x_{nl}(n)=c_2(n)x^2(n)+c_1(n)x(n).$$

The non-linearity of the characteristic applied at block 104 allows the system to generate signal components at frequencies which may not have been present in the received acoustic signal x(n). The use of power characteristics may allow signal components comprising multiples of a fundamental frequency to generate harmonics or missing fundamental waves.

The coefficients of the non-linear characteristic need not be time dependent. Some systems may use time dependant coefficients while other systems may use coefficients that are not time dependant. When using time dependent coefficients, the system may compensate for changes to the signal due to the non-linear characteristic used. Specifically, the system may adapt the coefficients of the non-linear characteristic to the current input signal such that only a small change in power from input signal to output signal occurs. In some systems, the coefficients of the nonlinear characteristic may chosen according to the following equations:

$$c_2(n) = \frac{K_{nl,2}}{g_{max}x_{max}(n) + \varepsilon},$$

$$c_1(n) = K_{nl,1} - c_2(n)x_{max}(n).$$

The constant $\epsilon$ may be used to avoid the potential of a division by zero. In some systems, the other constants may take the following values:

$$K_{nl,1}=1.2,$$

$$K_{nl,2}=1,$$

$$g_{max}=2,$$

$$\epsilon=10^{-5}.$$

The output signal $x_{nl}(n)$ of the adaptive quadratic characteristic at block 104 comprises the desired low frequency signal components. The output signal $x_{nl}(n)$ also comprises the frequency components in the same range as the received acoustic signal x(n). The received acoustic signal x(n) may be a telephone signal with a bandwidth of about 300 Hz to about 3400 Hz. In this situation, the output signal $x_{nl}(n)$ comprises frequency components in the range from about 300 Hz to about 3400 Hz, in addition to the generated frequency components below about 300 Hz. The output signal $x_{nl}(n)$ may also comprise frequency components below the fundamental speech frequency, such as below about 100 Hz. The system may remove the frequency components below about 100 Hz and between about 300 Hz to about 3400 Hz by passing the output signal $x_{nl}(n)$ through a band-pass filter 106. The band-pass filter 106 may comprise a high-pass filter component and a low-pass filter component. The high-pass filter component of the band-pass filter 106 may remove low frequency disturbances. The high-pass filter component may be an IIR filter, such as a Butterworth filter of first order. The output signal of such a high-pass filter may be determined according to the following equation:

$$\tilde{x}_{nl}(n)=b_{hp}(x_{nl}(n-1)-x_{nl}(n))+a_{hp}\tilde{x}_{nl}(n-1)$$

In some systems, the filter coefficients may take the following values:

$$a_{hp}=0.95,$$

$$b_{hp}=0.99.$$

The low-pass filter component of the band-pass filter 106 may remove or substantially dampen high frequency components. The low-pass filter component may remove or substantially dampen the frequency components that were part of the received acoustic signal x(n), such as the frequency components that are within the telephone band. The low-pass filter component may be an IIR filter of a higher order according to the following equation:

$$y_{low}(n) = \sum_{i=0}^{N_{lp}} b_{hp,i}\tilde{x}_{nl}(n-i) + \sum_{i=1}^{\tilde{N}_{lp}} a_{hp,i}y_{low}(n-i)$$

Figure 3:
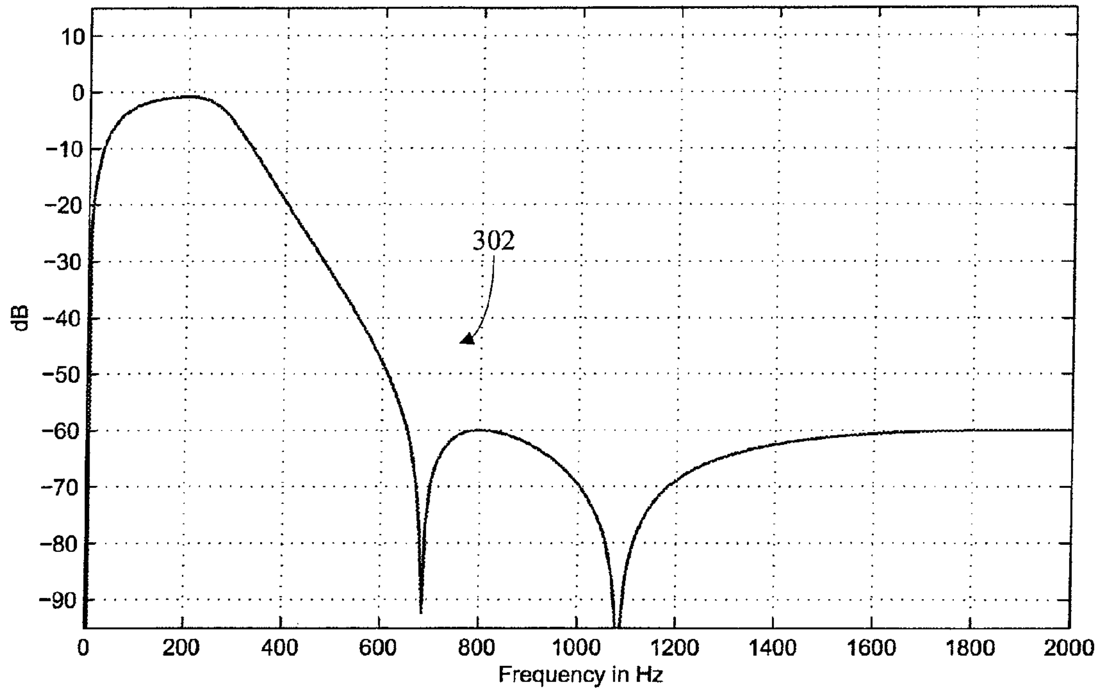
FIG. 3 is a graph of the frequency response of a band-pass filter.

The low-pass component of the band-pass filter 106 may be a Chebyshev low-pass filter of the order $N_{lp}=\tilde{N}_{lp}=4, \ldots, 7$. FIG. 3 illustrates the frequency response 302 of the band-pass filter 106 having a combination of the high-pass and low-pass filter components. The output of the band-pass filter 106 comprises the lower bandwidth extension signal $y_{low}(n)$.

After the system generates the upper bandwidth extension signal $y_{high}(n)$ and/or the lower bandwidth extension signal $y_{low}(n)$, the bandwidth extension system combines the generated signal(s) with the received acoustic signal x(n) or a modified version of the received acoustic signal x(n) to generate an acoustic signal with extended bandwidth y(n). When combining the received acoustic signal x(n) with the generated bandwidth extension signals (e.g., the upper bandwidth extension signal $y_{high}(n)$ and/or the lower bandwidth extension signal $y_{low}(n)$), the system may consider whether the received acoustic signal x(n) includes wanted signal components, such as a speech signal. Furthermore, the system may consider whether the received acoustic signal x(n) contains disturbances. In view of these considerations, the resulting acoustic signal with extended bandwidth y(n) may formed as a weighted sum of the received acoustic signal x(n), the upper bandwidth extension signal $y_{high}(n)$, and/or the lower bandwidth extension signal $y_{low}(n)$. Specifically, the bandwidth extension system may comprise a signal combination unit to weight and combine frequency components from the received acoustic signal x(n), the upper bandwidth extension signal $y_{high}(n)$, and/or the lower bandwidth extension signal $y_{low}(n)$. The weighted sum may result in a damping or an amplification of one or more of the component signals. These weights may be chosen to be time dependent.

The following provides an example of possible weights to be used in the weighted sum. For these exemplary weights, an estimation of the short time power of the received acoustic signal and of the upper bandwidth extension signal may be used. For this purpose, an IIR smoothing of first order of the modulus of the signals x(n) and $x_{high}(n)$ is performed according to the following equations:

$$\overline{x(n)}=\beta_x|x(n)|+(1-\beta_x)\overline{x(n-1)},$$

$$\overline{x_{high}(n)}=\beta_x|x_{high}(n)|+(1-\beta_x)\overline{x_{high}(n-1)}.$$

The time constant $\beta_x$ may be chosen from the following range:

$$0<\beta_x<1.$$

In some systems, the time constant $\beta_x$ may take the value of 0.01.

From these short time smoothed values, estimations for the noise level can be determined according to the following equations:

$$\overline{b(n)} = \max\{b_{min}, \min\{\overline{x(n)}, \overline{b(n-1)}(1+\varepsilon)\}\},$$

$$\overline{b_{high}(n)} = \max\{b_{min}, \min\{\overline{x_{high}(n)}, \overline{b_{high}(n-1)}(1+\varepsilon)\}\}.$$

The constant $\epsilon$ may be chosen from the following range:

$$0<\epsilon<<1.$$

In some systems, the constant $\epsilon$ may take the value of 0.00005. The constant $b_{min}$ in the above equations may be used to avoid a situation where the estimation reaches the value 0 and stops at that point. If the signals are quantized with 16 bits, they may lie in the following amplitude range:

$$-2^{15} \leqq x(n) < 2^{15}$$

For this modulation range, some systems may choose $b_{min}=0.01$.

Figure 4:
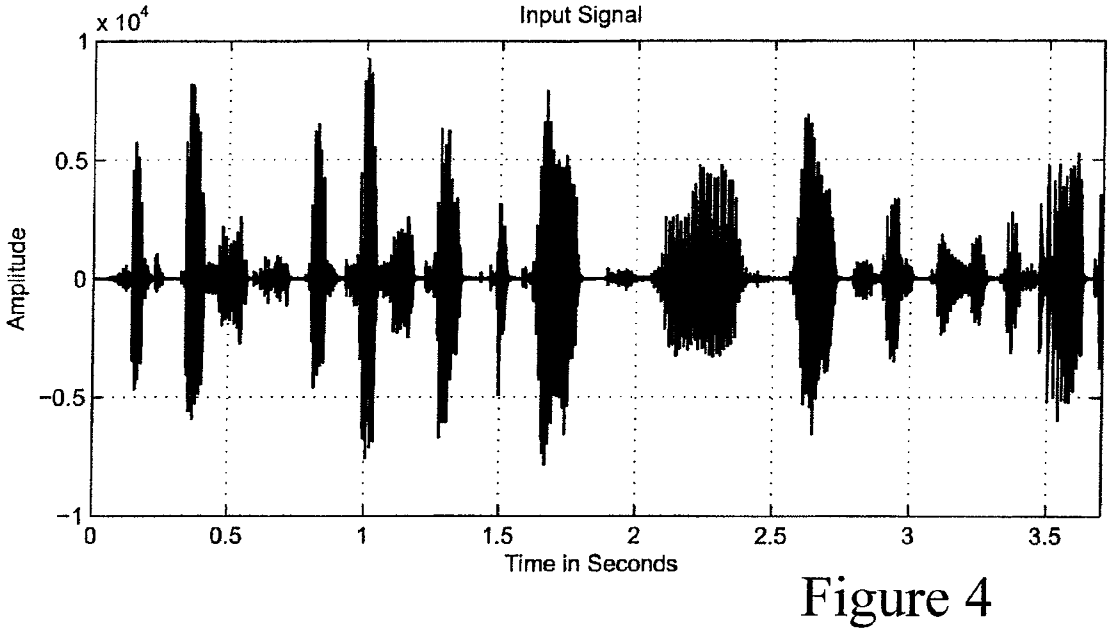
FIG. 4 is a graph of an acoustic signal.
Figure 5:
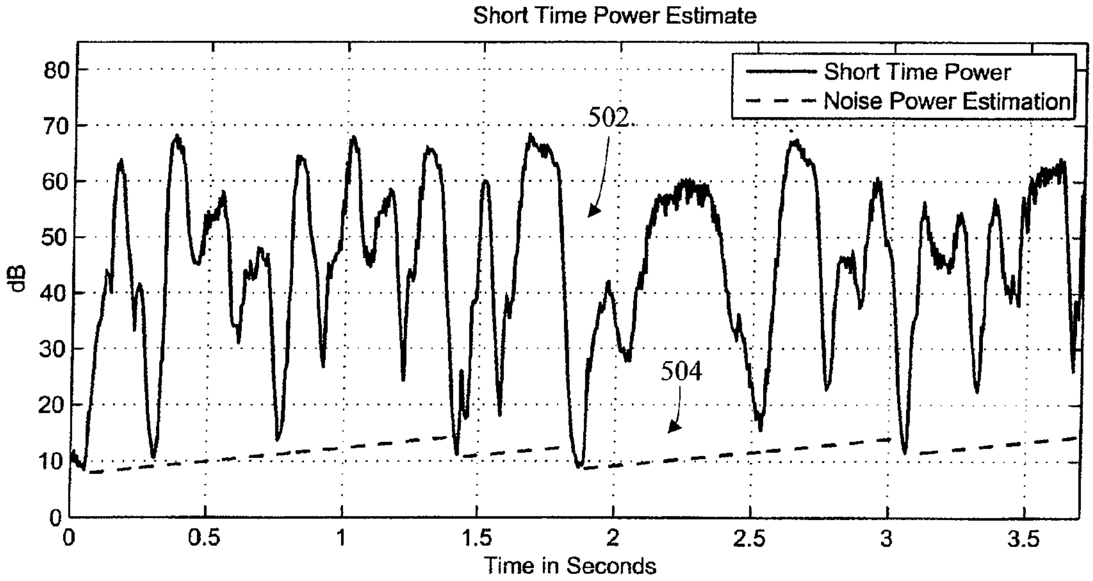
FIG. 5 is a graph of a short time power estimation and a noise power estimation that correspond to the acoustic signal of FIG. 4.

FIG. 4 is a representation of an input speech signal, such as the received acoustic signal x(n). FIG. 5 illustrates a short time power estimation and a noise power estimation that correspond to the received acoustic signal x(n) of FIG. 4. Line 502 in FIG. 5 represents the estimated short time power $\overline{x(n)}$ of the received acoustic signal x(n). Line 504 in FIG. 5 represents the noise power estimation $\overline{b(n)}$. The short time power estimation may be used to determine different factors for weighting the signal components. Some systems may apply only individual weighting factors to the signal components. Other systems may apply a plurality of weighting factors to the signal components.

A first weighting factor $g_{snr}(n)$ that may be applied is a function of an estimated signal-to-noise ratio of the received acoustic signal x(n). Specifically, the first weighting factor may be a monotonically increasing function of the estimated signal-to-noise ratio of the received acoustic signal x(n). The estimated signal-to-noise ratio may be based on an estimation of the absolute value or modulus of the noise level through an IIR smoothing of first order of the absolute value of the received acoustic signal x(n) or the filtered acoustic signal $x_{high}(n)$. If the received acoustic signal x(n) contains speech passages with a low signal-to-noise ratio, then this weighting factor may be used to damp the upper bandwidth extension signal $y_{high}(n)$. If the received acoustic signal x(n) contains speech passages with a high signal-to-noise ratio, then some systems may not use this weighting factor or may only perform a slight amount of dampening with this weighting factor. This may be achieved, for example, according to the following equation:

$$g_{snr}(n) = \begin{cases} \beta_{snr} g_{gnr,max} + (1-\beta_{snr}) g_{snr}(n-1), & \text{if } \overline{x(n)} > K_{snr}\overline{b(n)}, \\ \beta_{snr} g_{snr,min} + (1-\beta_{snr}) g_{snr}(n-1), & \text{else.} \end{cases}$$

The parameters $g_{snr,max}$ and $g_{snr,min}$ correspond to the maximal and minimal damping. In some systems, these parameters may take the following values:

$$g_{snr,max}=1$$

$$g_{snr,min}=0.3.$$

In some systems, the dampening value may take the following value:

$$K_{snr}=3$$

Where the estimated signal power exceeds the estimated noise power by approximately 10 dB, then the system may reduce the damping. The time constant of the IIR smoothing may be chosen from the following range:

$$0 < \beta_{snr} \leqq 1$$

In some systems, the time constant $\beta_{snr}$ of the IIR smoothing may take the value of 0.005.

Figure 6:
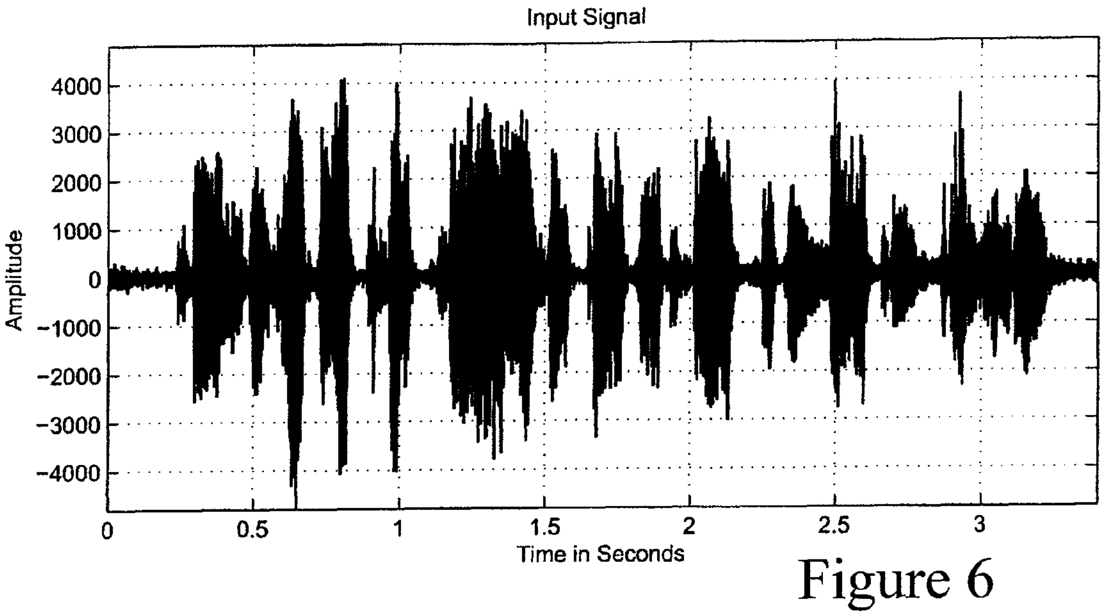
FIG. 6 is a graph of an acoustic signal.
Figure 7:
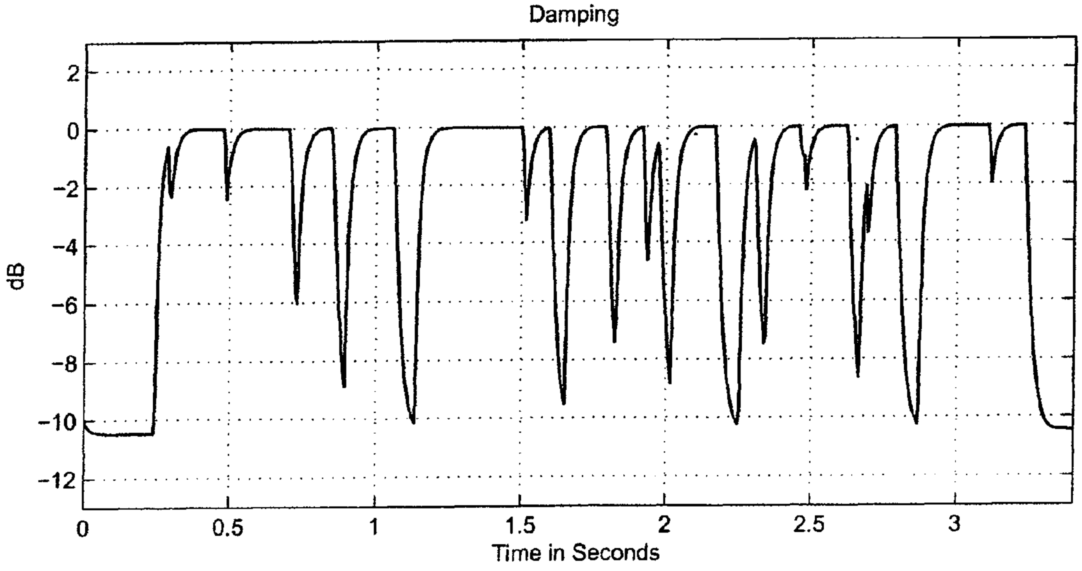
FIG. 7 is a graph of a dampening factor that corresponds to the acoustic signal of FIG. 6.

FIG. 6 is a representation of an input signal, such as the received acoustic signal x(n). FIG. 7 illustrates a damping factor $g_{snr}(n)$ in dB that corresponds to the received acoustic signal x(n) of FIG. 6. As seen through a comparison of FIGS. 6 and 7, the damping may be increased during speech pauses of the received acoustic signal x(n).

A second weighting factor $g_{noise}(n)$ may be used to account for high input background noise levels. The second weighting factor may be used as an alternative or in addition to the first weighting factor. If both weighting factors are applied, then a product of the first and second weighting factors may be used. The application of the second weighting factor may result in a more natural output signal.

The second weighting factor may be a monotonically decreasing function of the estimated noise level in the upper bandwidth extension signal $y_{high}(n)$. The second weighting factor may provide more damping if the noise level at high frequencies is high. The second weighting factor $g_{noise}(n)$ may be increased if the noise level in the upper bandwidth extension signal $y_{high}(n)$ exceeds a predefined threshold. Furthermore, the system may implement a hysteresis to avoid a situation where the second factor varies too largely. In some systems, the factor $g_{noise}(n)$ may be determined according to the following equation:

$$g_{noise}(n) = \begin{cases} \min\{1, g_{noise}(n-1)\Delta_{inc}\}, & \text{if } \overline{b_{high}(n)} < \overline{b_0}K_b, \\ \max\{g_{noise,min}, g_{noise}(n-1)\Delta_{dec}\}, & \text{if } \overline{b_{high}(n)}K_b > \overline{b_0}, \\ g_{noise}(n-1), & \text{else.} \end{cases}$$

In some systems, the constant $g_{noise,min}$ may take the value of:

$$g_{noise,min}=0.01.$$

For a hysteresis of approximately 6 dB, the system may use the value:

$$K_b=1.4$$

The additional factors may fulfill the following relation:

$$0<\Delta_{dec}<1<\Delta_{inc}.$$

In some systems, the additional factors may take the values of:

$$\Delta_{dec}=0.9999,$$

$$\Delta_{inc}=1.0001.$$

In these systems, a correction of about 10 dB/s may be obtained.

A third weighting factor $g_{hlr}(n)$ may be used for the upper bandwidth extension signal $y_{high}(n)$ to damp the upper bandwidth extension signal $y_{high}(n)$ in situations where most of the signal power is present at low frequencies. The third weighting factor may be used as an alternative or in addition to the first and/or second weighting factors. The weight of the upper bandwidth extension signal $y_{high}(n)$ may be a product of the first factor, the second factor and/or the third factor.

The third weighting factor may be a monotonically increasing function of the ratio of the estimated signal level of the received acoustic signal x(n) to the estimated signal level of the upper bandwidth extension signal $y_{high}(n)$. Therefore, a damping of the upper bandwidth extension signal $y_{high}(n)$ may be performed if most of the signal power is present at low frequencies. The application of the third weighting factor may result in a more natural output signal. The third weighting factor may be achieved according to the following equation:

$$g_{hlr}(n) = \begin{cases} \beta_{hlr} g_{hlr,max} + (1-\beta_{hlr}) g_{hlr}(n-1), & \text{if } \overline{x(n)} < K_{hlr}\overline{x_{high}(n)}, \\ \beta_{hlr} g_{hlr,min} + (1-\beta_{hlr}) g_{hlr}(n-1), & \text{else.} \end{cases}$$

In some systems, the damping values in this IIR smoothing may be chosen to be:

$$g_{hlr,max}=1$$

$$g_{hlr,min}=0.1.$$

For the ratio of the estimated signal power $\overline{x(n)}$ of the received acoustic signal and the high frequency power $\overline{x_{high}(n)}$, the system may use a threshold of:

$$K_{hlr}=15$$

The smoothing constant $\beta_{hlr}$ may be chosen to satisfy the following range:

$$\beta_{hlr}\leqq 1.$$

In some systems, the smoothing constant $\beta_{hlr}$ may take the value:

$$\beta_{hlr}=0.0005.$$

The bandwidth extension system may also weight or modify the signal components that are within the frequency band of the received acoustic signal x(n). This may yield a more harmonic output signal. Such a modification or weighting of the received acoustic signal x(n) may be achieved through a FIR filter with two time dependent coefficients according to the following equation:

$$y_{tel}(n)=h_0(n)x(n)+h_1(n)x(n-1)$$

The filter coefficients may depend on each other according to the following equations:

$$h_0(n) = \frac{1}{1 - ag_h(n)}$$

$$h_1(n) = 1 - h_0(n).$$

A weighted sum of the received acoustic signal x(n) at time n and at time n−1 is performed by filter 108. The weights for this processing as well as the weighting factors for the other signal components are determined at block 107.

The filter 108 may show a small high-pass characteristic which can be activated and de-activated through the parameter a and the time dependent factor $g_h(n)$. The parameter a may be chosen from the following range:

$$0.2<a<0.8$$

Small values for a may result in only a small increase in the upper frequencies, while large values may result in a large increase. The factor $g_h(n)$ may be chosen according to the following equation:

$$g_h(n)=g_{snr}(n)g_{noise}(n).$$

Figure 8:
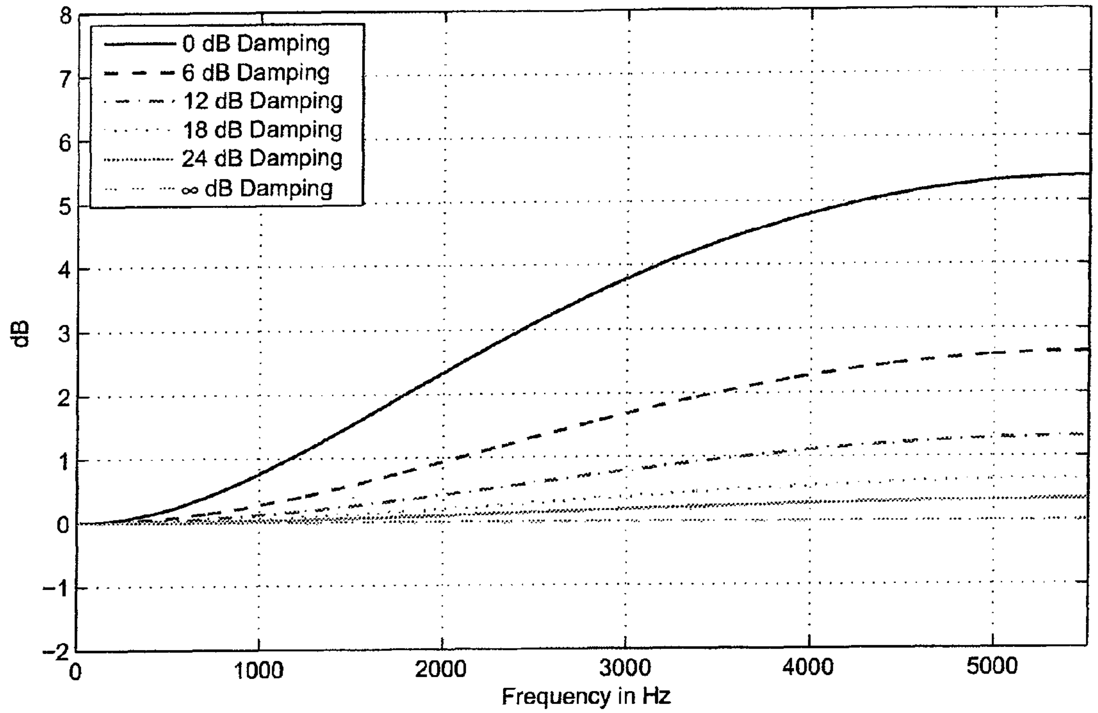
FIG. 8 is a graph of various frequency responses of a high-pass filter.

In some systems, the filter 108 may be activated only during speech activity and only for received acoustic signals with low noise levels. FIG. 8 illustrates filter characteristics with a parameter of a=0.3 at different factors $g_h(n)$.

The lower bandwidth extensions signal $y_{low}(n)$ may be weighted as well using a time dependent factor $g_{low}(n)$ according to the following equation:

$$g_{low}(n)=g_{low,fix}g_{snr}(n);$$

The constant factor $g_{low,fix}$ may be chosen to be within the following range:

$$0\leqq g_{low,fix}\leqq 10.$$

In some systems, the factor $g_{low,fix}$ may take a value of 2.

The acoustic signal with an extended bandwidth y(n) may be formed from a weighted sum of the modified received acoustic signal $y_{tel}(n)$, the lower bandwidth extension signal $y_{low}(n)$, and the upper bandwidth extension signal $y_{high}(n)$ according to the following equation:

$$y(n)=y_{tel}(n)+g_{low}(n)y_{low}(n)+g_{high}(n)y_{high}(n).$$

The overall weighting factor for the upper bandwidth extension signal $y_{high}(n)$ may be chosen according to the following equation:

$$g_{high}(n)=g_{high,fix}g^2{snr}(n)g_{noise}(n)g_{hfr}(n).$$

The constant factor $g_{high,fix}$ may also be chosen from the following range:

$$0\leqq g_{high,fix}\leqq 10.$$

In some systems, the constant factor may take a value of $g_{high,fix}=4$.

Figure 9:
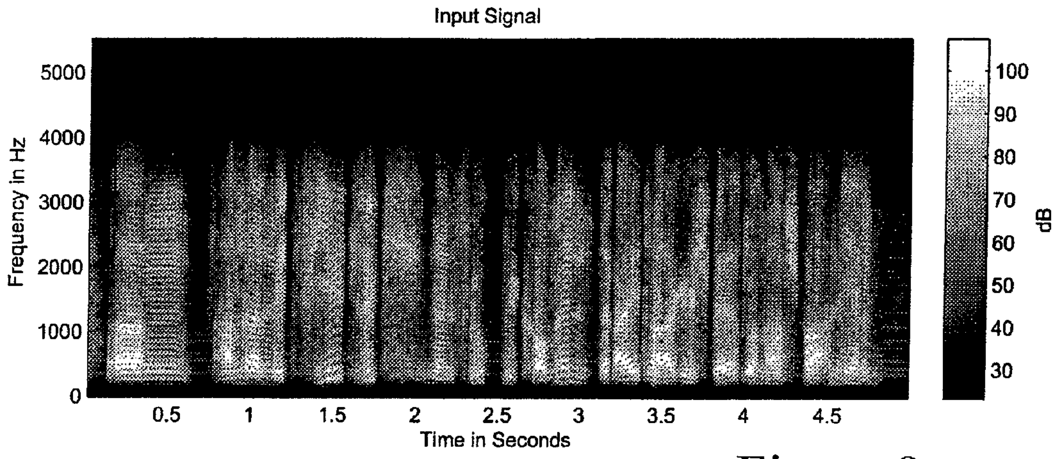
FIG. 9 is a graph of an acoustic signal.
Figure 10:
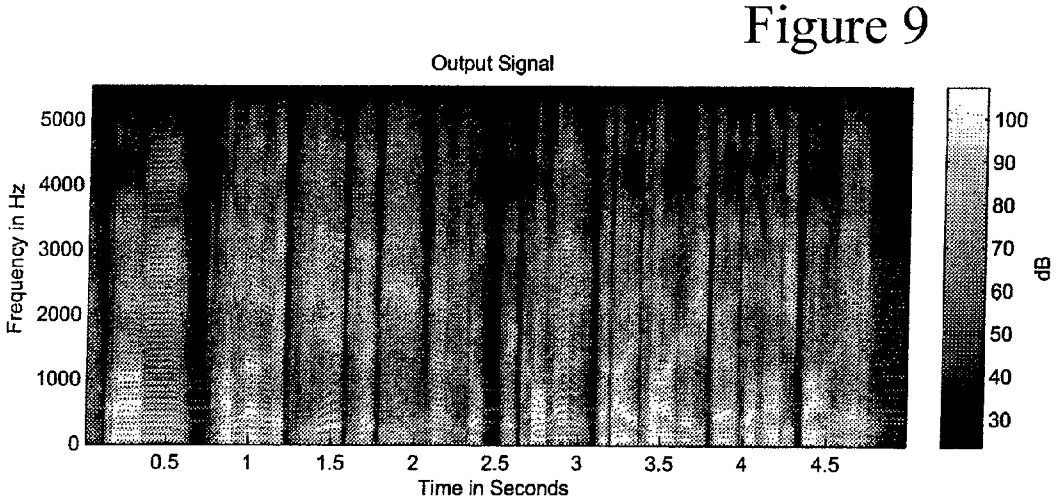
FIG. 10 is a graph of the acoustic signal of FIG. 9 with an extended bandwidth.

FIG. 9 illustrates a time versus frequency analysis of an acoustic signal, such as the received acoustic signal x(n). The received acoustic signal x(n) may be an acoustic signal received through a GSM telephone. In FIG. 9, the received acoustic signal x(n) lacks frequency components below approximately 200 Hz and above approximately 3700 Hz. After extending the bandwidth of the acoustic signal x(n), such as by addition of the upper bandwidth extension signal $y_{high}(n)$ and the lower bandwidth extension signal $y_{low}(n)$, the missing frequency components are re-constructed. FIG. 10 illustrates a time versus frequency analysis of the acoustic signal with extended bandwidth y(n). As shown in FIG. 10, the acoustic signal with extended bandwidth y(n) includes frequency components below approximately 200 Hz and above approximately 3700 Hz.

Each of the processes described may be encoded in a computer readable medium such as a memory, programmed within a device such as one or more integrated circuits, one or more processors or may be processed by a controller or a computer. If the processes are performed by software, the software may reside in a memory resident to or interfaced to a storage device, a communication interface, or non-volatile or volatile memory in communication with a transmitter. The memory may include an ordered listing of executable instructions for implementing logic. Logic or any system element described may be implemented through optic circuitry, digital circuitry, through source code, through analog circuitry, or through an analog source, such as through an electrical, audio, or video signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A “computer-readable medium,” “machine-readable medium,” “propagated-signal” medium, and/or “signal-bearing medium” may comprise any device that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection having one or more wires, a portable magnetic or optical disk, a volatile memory such as a Random Access Memory “RAM,” a Read-Only Memory “ROM,” an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

Although selected aspects, features, or components of the implementations are described as being stored in memories, all or part of the systems, including processes and/or instructions for performing processes, consistent with the system may be stored on, distributed across, or read from other machine-readable media, for example, secondary storage devices such as hard disks, floppy disks, and CD-ROMs; a signal received from a network; or other forms of ROM or RAM resident to a processor or a controller.

Specific components of a system may include additional or different components. A controller may be implemented as a microprocessor, microcontroller, application specific integrated circuit (ASIC), discrete logic, or a combination of other types of circuits or logic. Similarly, memories may be DRAM, SRAM, Flash, or other types of memory. Parameters (e.g., conditions), databases, and other data structures may be separately stored and managed, may be incorporated into a single memory or database, or may be logically and physically organized in many different ways. Programs and instruction sets may be parts of a single program, separate programs, or distributed across several memories and processors.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

We claim:

1. A digital-controller-implemented method for providing increased bandwidth, in a digitally sampled acoustic speech signal having a restricted bandwidth, so as to improve intelligibility of the speech signal, the method comprising:

using a digital-controller-implemented spectral shifter, coupled to the speech signal to generate digitally an upper bandwidth extension signal in which at least a portion of the speech signal is shifted upwardly by a predetermined shifting frequency value, and wherein the spectral shifter is configured to perform a cosine modulation of the speech signal;

using a first digital-controller-implemented high pass filter, coupled to an output of the spectral shifter, so as to digitally generate a filtered upper bandwidth extension signal by filtering the upper bandwidth extension signal to remove frequency components below a shifter output cutoff frequency;

using a second digital-controller-implemented high pass filter, disposed between the speech signal and the spectral shifter, to remove frequency components to the spectral shifter that are below a shifter input cutoff frequency; and generating digitally an extended bandwidth speech signal based on the speech signal and the filtered upper bandwidth extension signal.

2. The method of claim 1, where the cutoff frequency for the first high-pass filter, used to filter the upper bandwidth extension signal, corresponds to the sum of the shifter input cutoff frequency plus and the predetermined shifting frequency value.

3. The method of claim 1, wherein generating the extended bandwidth speech signal comprises using a digital-controller-implemented summer to generate a weighted sum of the speech signal and the filtered upper bandwidth extension signal.

4. The method of claim 3, where weights used in the weighted sum are time dependent.

5. The method of claim 3, where the filtered upper bandwidth extension signal is weighted with a first factor, and where the first factor is a function of an estimated signal-to-noise ratio of the speech signal.

6. The method of claim 5, where the first factor is a monotonically increasing function of the estimated signal-to-noise ratio of the speech signal.

7. The method of claim 5, where the filtered upper bandwidth extension signal is weighted with a second factor, and where the second factor is a function of an estimated noise level in the upper bandwidth extension signal or the filtered upper bandwidth extension signal.

8. The method of claim 7, where the second factor is a monotonically decreasing function of the estimated noise level in the upper bandwidth extension signal or the filtered upper bandwidth extension signal.

9. The method of claim 7, where the estimated signal-to-noise ratio or the estimated noise level are estimated based on the respective short time signal power.

10. The method of claim 7, where the filtered upper bandwidth extension signal is weighted with a third factor, and where the third factor is based on a ratio of an estimated signal level of the speech signal to an estimated signal level of the upper bandwidth extension signal or the filtered upper bandwidth extension signal.

11. The method of claim 10, where the third factor is a monotonically increasing function of the ratio of the estimated signal level of the speech signal to the estimated signal level of the upper bandwidth extension signal or the filtered upper bandwidth extension signal.

12. The method of claim 3, where the speech signal is weighted by a weighted sum of the speech signal at a current time and at the current time minus one time step.

13. The method of claim 12, where weights used in the weighted sum of the speech signal at the current time and at the current time minus one time step are functions of an estimated signal-to-noise ratio of the speech signal or of an estimated noise level in the upper bandwidth extension signal or the filtered upper bandwidth extension signal.

14. The method of claim 1, further comprising generating a lower bandwidth extension signal for extending the speech signal at lower frequencies.

15. The method of claim 14, where the act of generating the lower bandwidth extension signal comprises applying a nonlinear quadratic characteristic on the acoustic signal.

16. The method of claim 15, where the nonlinear quadratic characteristic is time dependent.

17. The method of claim 15, where the act of applying the nonlinear quadratic characteristic results in an output signal, and where the act of applying the nonlinear quadratic characteristic is followed by band-pass filtering the output signal.

18. The method of claim 14, where the act of generating the extended bandwidth acoustic signal comprises generating a weighted sum of the acoustic signal, the filtered upper bandwidth extension signal, and the lower bandwidth extension signal.

19. The method of claim 14, where the lower bandwidth extension signal is weighted with a factor that is a function of an estimated signal-to-noise ratio of the acoustic signal.

20. A non-transitory computer readable medium encoded with computer executable instructions that, when loaded into memory associated with a suitably configured digital controller in a digital device, causes the device to perform a method for providing increased bandwidth, in a digitally sampled acoustic speech signal having a restricted bandwidth, so as to improve intelligibility of the speech signal, the method comprising:

using a digital-controller-implemented spectral shifter, coupled to the speech signal to generate digitally an upper bandwidth extension signal in which at least a portion of the speech signal is shifted upwardly by a predetermined shifting frequency value, and wherein the spectral shifter is configured to perform a cosine modulation of the speech signal;

using a first digital-controller-implemented high pass filter, coupled to an output of the spectral shifter, so as to digitally generate a filtered upper bandwidth extension signal by filtering the upper bandwidth extension signal to remove frequency components below a cutoff frequency;

using a second digital-controller-implemented high pass filter, disposed between the speech signal and the spectral shifter, to remove frequency components to the spectral shifter that are below a shifter input cutoff frequency; and generating an extended bandwidth speech signal based on the speech signal and the filtered upper bandwidth extension signal.

* * * * *